(12) United States Patent     (10) Patent No.:   US 12,588,456 B2

Iu et al.                 (45) Date of Patent:     Mar. 24, 2026

(54) REFLECTOR PLATE FOR SUBSTRATE PROCESSING

(71) Applicant: Applied Materials, Inc., Santa Clara, CA (US)

(72) Inventors: Dongming Iu, Union City, CA (US); Jian Wu, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 759 days.

(21) Appl. No.: 17/903,964

(22) Filed: Sep. 6, 2022

(65) Prior Publication Data

US 2024/0079252 A1     Mar. 7, 2024

(51) Int. Cl.
H01L 21/67         (2006.01)

(52) U.S. Cl.
CPC .. H01L 21/67115 (2013.01); H01L 21/67103 (2013.01); H01L 21/67248 (2013.01)

(58) Field of Classification Search
CPC ......... H01L 21/67115; H01L 21/67103; H01L 21/67248
USPC ....................................................... 392/416
See application file for complete search history.

(56) References Cited

U.S. PATENT DOCUMENTS

| | | | |
|---|---|---|---|
| 5,660,472 A | 8/1997 | Peuse et al. | |
| 5,790,751 A | 8/1998 | Gronet et al. | |
| 5,892,886 A | * 4/1999 | Sandhu | ............. H01L 21/67115 |
| | | | 392/416 |
| 6,280,183 B1 | 8/2001 | Mayur et al. | |
| 6,860,634 B2 | 3/2005 | Shigeoka | |
| 9,449,858 B2 | 9/2016 | Koelmel et al. | |
| 2003/0184696 A1 | 10/2003 | Shimanuki et al. | |
| 2004/0079746 A1 | 4/2004 | Jennings et al. | |
| 2012/0070136 A1 | 3/2012 | Koelmel et al. | |
| 2012/0244448 A1 | 9/2012 | Hallum et al. | |
| 2022/0163394 A1 | 5/2022 | Aderhold | |

FOREIGN PATENT DOCUMENTS

| | | |
|---|---|---|
| KR | 100650895 B1 | 11/2006 |
| KR | 20220028216 A | 3/2022 |
| WO | 2014204579 A1 | 12/2014 |

OTHER PUBLICATIONS

Aluminum: Characteristics, Uses and Problems (Year: 2016).*
International Search Report and Written Opinion dated Feb. 28, 2022 for Application No. PCT/US2021/057654.
International Search Report and Written Opinion dated Dec. 12, 2023 for Application No. PCT/US2023/030822.
Korean Office Action dated Dec. 8, 2025 for Application No. 10-2025-7010631.

* cited by examiner

*Primary Examiner* — Sang Y Paik

(74) *Attorney, Agent, or Firm* — Patterson + Sheridan, LLP

(57) ABSTRACT

A reflector plate assembly for processing a substrate includes a reflector plate having a first surface, wherein the first surface is a bare polished surface, a reflector disk embedded within the reflector plate from the first surface, a coating layer on the reflector disk, and a pyrometer disposed through an opening of the reflector disk.

20 Claims, 3 Drawing Sheets

REFLECTOR PLATE FOR SUBSTRATE PROCESSING

BACKGROUND

Field

Embodiments of the present disclosure generally relate to apparatus for processing a substrate, and more specifically to reflector plates for rapid thermal processing.

Description of the Related Art

Rapid thermal processing (RTP) is a process for annealing substrates during semiconductor fabrication. During this process, thermal radiation is used to rapidly heat a wafer in a controlled environment to a maximum temperature of over nine hundred degrees above room temperature. Reflector plates used for RTP processing of a substrate utilize pyrometers for wafer temperature measurement. State-of-the-art reflector plates are manufactured to optimize 100% reflectivity at the pyrometer wavelengths (e.g., between 700 nm to about 4000 nm) even though only 10% or less of the reflector plate area is used for the pyrometers. Such a mismatch results in unnecessarily high costs. Moreover, for purposes such as energy savings and improved heating performance of the wafer, reflector plates should reflect radiation of the whole pyrometer wavelengths at the entire surface of the wafer. However, combining both energy savings and improved heating performance in one uniform reflector plate is costly as such a reflector plate requires an optical stack of complex multi-layer coatings over the entire reflector plate, which can easily crack or peel at an elevated temperature.

There is a need for new and improved reflector plates for substrate processing.

SUMMARY

Embodiments of the present disclosure provide a reflector plate assembly for processing a substrate. The reflector plate assembly includes a reflector plate having a first surface, wherein the first surface is a bare polished surface, a reflector disk embedded within the reflector plate from the first surface, a coating layer on the reflector disk, and a pyrometer disposed through an opening of the reflector disk.

Embodiments of the present disclosure provide a reflector plate assembly for processing a substrate. The reflector plate assembly includes a reflector plate having a first surface, wherein the first surface is a bare polished surface, a reflector disk embedded within the reflector plate from the first surface, a coating layer on the reflector disk, a pyrometer disposed through an opening of the reflector disk, and an encapsulating layer on the coating layer.

Embodiments of the present disclosure provide a chamber for processing a substrate. The chamber includes a chamber body, a chamber lid disposed on the chamber body, the chamber lid comprising: a lid body, and a reflector plate assembly. The reflector plate assembly includes a reflector plate having a first surface, wherein the first surface is a bare polished surface, a plurality of reflector disks embedded within the reflector plate from the first surface, a coating layer on each reflector disk of the plurality of reflector disks, a plurality of pyrometers, wherein each pyrometer of the plurality of pyrometers is disposed through an opening of a reflector disk of the plurality of reflector disks, and an encapsulating layer on the coating layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus for processing a substrate, and more specifically to reflector plates for rapid thermal processing.

A reflector plate assembly according to the embodiments described herein includes a plurality of reflector disks having coating thereon positioned within a reflector plate having a bare mechanically polished surface with no coating thereon. The coating of the reflector disks with gold (Au) or chromium (Cr) enhances emissivity of the reflector disks. The coating on the reflector disks is further encapsulated with silicon oxide ($SiO_2$) or sapphire to reduce metal contamination.

As compared to a conventional reflector plate that has the entire surface coated with quartz or other material, which can crack or peel at an elevated temperature, in the reflector plate assembly according to the embodiments described herein, only the reflector disks are coated and the remaining surface of the reflector plate is not coated. Such selective coating of the reflector disks or smaller regions around the pyrometers increases reliability of the coating, and further reduces manufacturing cost and replacement cost.

Figure 1:
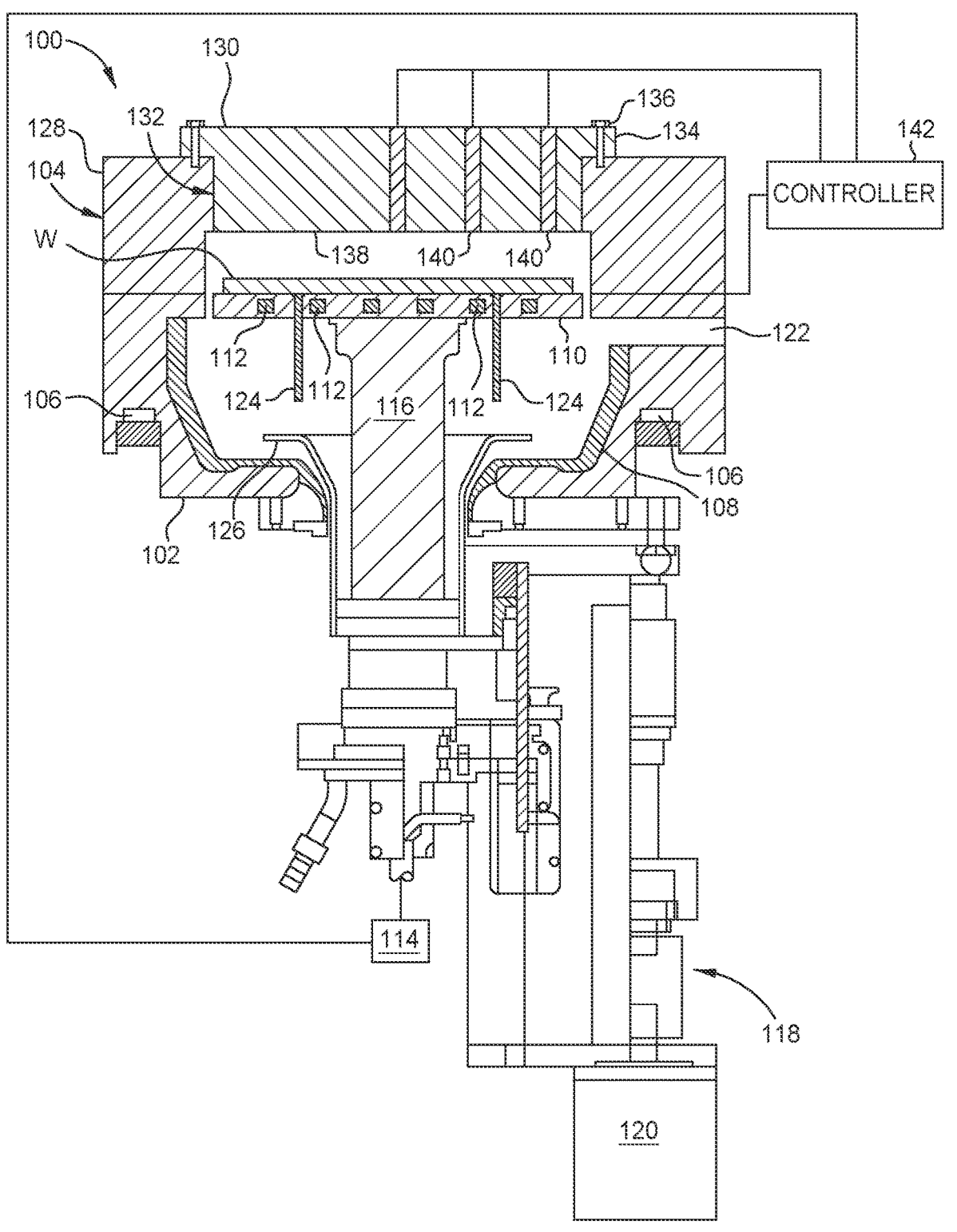
FIG. 1 is a sectional view of an example RTP chamber according to at least one embodiment of the present disclosure.

FIG. 1 is a sectional view of an RTP chamber 100 according to at least one embodiment of the present disclosure. The RTP chamber 100 is adapted to thermally process a substrate W positioned therein. The RTP chamber 100 includes a chamber body 102 and a chamber lid 104 disposed thereon. The chamber body 102 includes a fluid passage 106 formed therein to flow a temperature control fluid therethrough to cool the chamber body 102 during processing. Cooling of the chamber body 102 reduces the probability of degradation of the chamber body 102 due to thermal stresses during heating of the substrate W. A liner 108, formed from a thermally insulating material such as aluminum nitride, is disposed around the interior surface of the chamber body 102 to facilitate heat containment within the chamber body and to increase thermal processing efficiency.

A substrate support 110 is positioned within the chamber body 102. The substrate support 110 can be formed from, e.g., sintered aluminum nitride. The substrate support 110 includes a plurality of heating elements 112, such as resistive heating elements embedded therein, to facilitate heating of the substrate W during processing. The heating elements 112 are coupled to a power source 114 by wires disposed through a support shaft 116. The heating elements 112 provide for heating of the substrate W via conduction, and can heat the substrate W to a temperature of about 20° C. to about 1000° C., such as from about 25° C. to about 500° C. Additionally, or alternatively, other types of heating such as radiation from lamp bulbs can be installed to provide heat to a substrate.

The support shaft 116 is coupled to the underside of the substrate support 110 and supports the substrate support 110. The support shaft 116 is coupled to a lifter assembly 118 which includes an actuator 120, such as a stepper motor (not shown), to facilitate positioning of the substrate W in a processing position adjacent the chamber lid 104. The lifter assembly 118 also facilitates removal of the substrate W from the chamber body 102 through an opening 122 (e.g., a slit valve). The lifter assembly 118 is adapted to actuate the substrate support 110 in a vertical direction to allow lift pins 124 to contact a lift plate 126 positioned within the chamber body 102. Contact of the lift pins 124 with the lift plate 126 lifts the substrate W from the surface of the substrate support 110 as the substrate support 110 is lowered. The substrate W is maintained on the lift pins 124 at a position which allows for removal of the substrate W from the chamber body 102 through the opening 122 by a robot (not shown).

The chamber lid 104 is positioned on the chamber body 102. The chamber lid 104 includes a lid body 128 and a reflector plate 130. The reflector plate 130 has a circular shape and is disposed within a circular opening 132 located within the lid body 128. The reflector plate 130 has an annular lip 134 having a diameter greater than the circular opening 132 to support the reflector plate 130 on the top surface of the lid body 128. The annular lip has a plurality of openings therethrough to accommodate fasteners 136, such as bolts, to secure the reflector plate 130 to the lid body 128. The reflector plate 130 is positioned within and extends through the circular opening 132. A surface 138 of the reflector plate 130 is positioned adjacent the substrate W. Pyrometers 140 are disposed through the reflector plate 130 to measure the temperature of the substrate W. Generally, one pyrometer 140 is adapted to measure the temperature of the substrate W corresponding to a zone of the substrate support 110 having an individual heating element 112 therein (only three pyrometers 140 are illustrated in FIG. 1). It is contemplated, however, that each zone of the substrate support 110 may have more than one corresponding pyrometer 140 for increased temperature monitoring. Each pyrometer 140 is coupled with a controller 142, which is likewise coupled with the power source 114. The controller 142 facilitates closed loop control of each zone of the substrate support 110 by controlling the power applied to each of the heating elements 112 by the power source 114.

Figure 2:
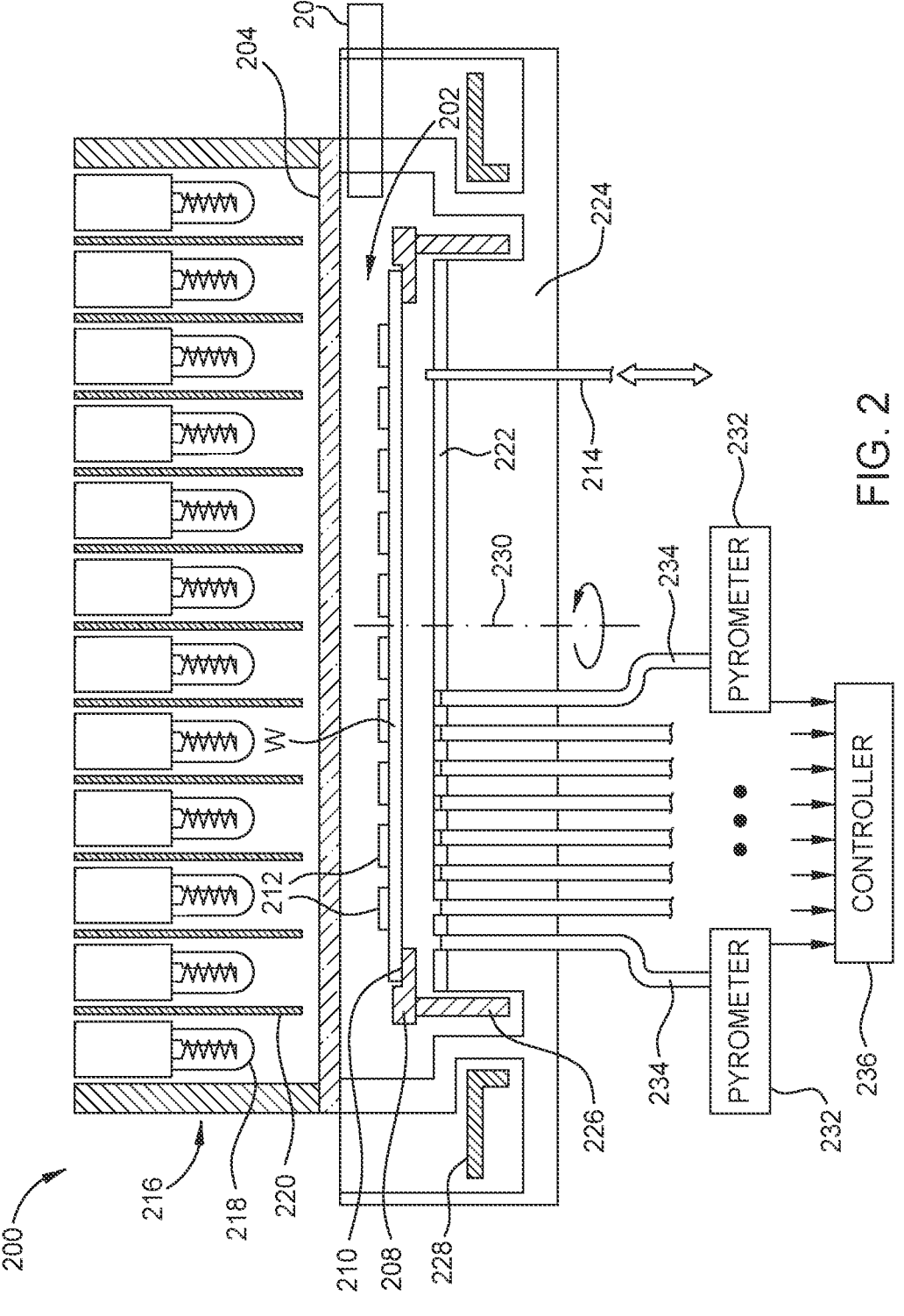
FIG. 2 is a sectional view of an example RTP chamber according to at least one embodiment of the present disclosure.

FIG. 2 schematically represents an RTP chamber 200 according to at least one embodiment of the present disclosure. The RTP chamber 200 includes a process area 202 below a transparent quartz window 204. A substrate W, for example, a semiconductor substrate such as a silicon wafer to be thermally processed, is passed through an access port 206 into the process area 202 of the RTP chamber 200. The substrate W is supported on its periphery by a substrate support shown in this embodiment as an edge ring 208, which may have an annular sloping shelf 210 contacting the corner of the substrate W. The substrate W is oriented such that processed features 212 already formed in a front surface of the substrate W face upwardly, referenced to the downward gravitational field, toward the process area 202. The transparent quartz window 204 can be located a distance from the substrate W such that the transparent quartz window 204 has minimal effect on cooling of the substrate during processing. Typically, the distance between the substrate W and the transparent quartz window 204 is on the order of 20 mm. Contrary to the schematic illustration, the features 212 for the most part do not project substantial distances beyond the surface of the substrate W but constitute patterning within and near the plane of the surface. Lift pins 214 may be raised and lowered to support the back side of the substrate W when the substrate is handed between a paddle or robot blade (not shown) bringing the substrate into the RTP chamber 200 and onto the edge ring 208. A radiant heating apparatus 216 is positioned above the transparent quartz window 204 to direct radiant energy toward the substrate W and to heat the substrate W. In the RTP chamber 200, the radiant heating apparatus includes a large number, i.e., enough to provide uniform radiation to the substrate heated in the chamber (e.g., about 409 being an exemplary number), of lamps 218 positioned in respective reflective tubes 220 arranged in a hexagonal close-packed array above the transparent quartz window 204. In some embodiments, the lamps 218 are high-intensity tungsten-halogen lamps.

It is desirable to control the temperature across the substrate W to a closely defined temperature uniform across the substrate W. In this regard, a reflector plate 222 extends parallel to and over an area greater than the substrate W and faces the back side of the substrate W. The reflector plate 222 reflects heat radiation emitted from the substrate W back toward the substrate W. In some embodiments, the spacing between the substrate W and the reflector plate 222 is about 3 mm to about 9 mm, and the aspect ratio of the width to the thickness of the cavity is greater than about 20. The reflector plate 222 can be supported on a water-cooled base 224 made of metal to heat sink excess radiation from the substrate W, especially during cool down. The process area 202 of the processing chamber has at least two substantially parallel walls, of which a first wall is the transparent quartz window 204, made of a material being transparent to radiation such as quartz, and a second wall substantially parallel to the first wall which is made of metal and is significantly not transparent. In some embodiments, the second wall is the reflector plate 222. The edge ring 208 is supported on a rotatable cylinder 226 that is magnetically coupled to a rotatable flange 228 positioned outside the chamber. A rotor (not shown) rotates the rotatable flange 228 and hence rotates the substrate W about its central axis 230, which is also the centerline of the generally symmetric chamber.

The lamps 218 are divided into zones arranged generally ring-like about the central axis 230. Control circuitry varies the voltage delivered to the lamps 218 in the different zones to tailor the radial distribution of radiant energy. Dynamic control of the zoned heating can be caused by one or more of a plurality of pyrometers 232 coupled through one or more optical light pipes 234 positioned to face the back side of the substrate W through apertures in the reflector plate

222 to measure the temperature across a radius of the rotating substrate W. The pyrometer 232 is disposed through the reflector plate 222.

The optical light pipes 234 can be formed of various structures including sapphire, metal, and silica fiber. A computerized controller 236 receives the outputs of the pyrometers 232 and controls the voltages supplied to the different rings of lamps 218 to dynamically control the radiant heating intensity and pattern during the processing. Pyrometers 232 generally measure light intensity in a narrow wavelength bandwidth of, e.g., about 40 nm in a range of, e.g., about 700 nm to about 4000 nm. The controller 236 or other instrumentation converts the light intensity to a temperature through the Planck distribution of the spectral distribution of light intensity radiating from a black-body held at that temperature.

The array of lamps 218 is sometimes referred to as the lamphead. However, other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized.

The RTP chamber 200 shown in FIG. 2 enables the edge ring 208 to be levitated at different vertical positions inside the RTP chamber 200 to permit control of thermal exposure of the substrate W. It will be understood that the configuration shown in FIG. 2 is not intended to be limiting. For example, the present disclosure is not limited to configurations in which the heat source or lamps are directed at one side or surface of the substrate and the pyrometers are directed at the opposite side of the substrate W.

Certain processing chambers, such as the RTP Centura™ or the RTP Centura XE™, manufactured by Applied Materials, Inc. of Santa Clara, California, can be used with the reflector plate assembly described herein. Alternatively, RTP chambers from other manufacturers can be used with the reflector plate assembly described herein.

Example Reflector Plate Assembly

Figure 3B:
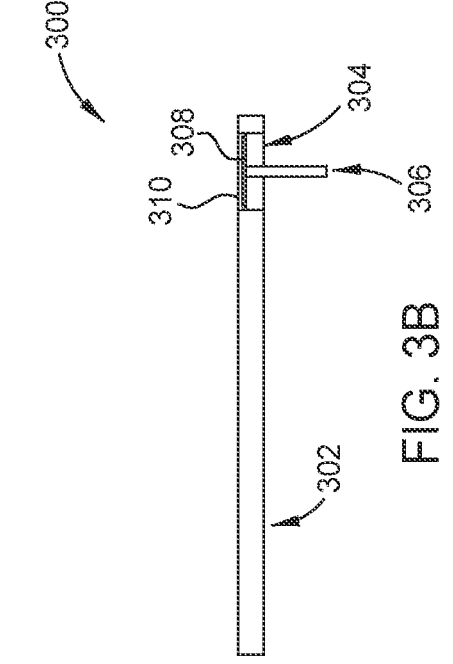
FIG. 3B is a cross-sectional view of the example reflector plate assembly shown in FIG. 3A according to at least one embodiment of the present disclosure.
Figure 3A:
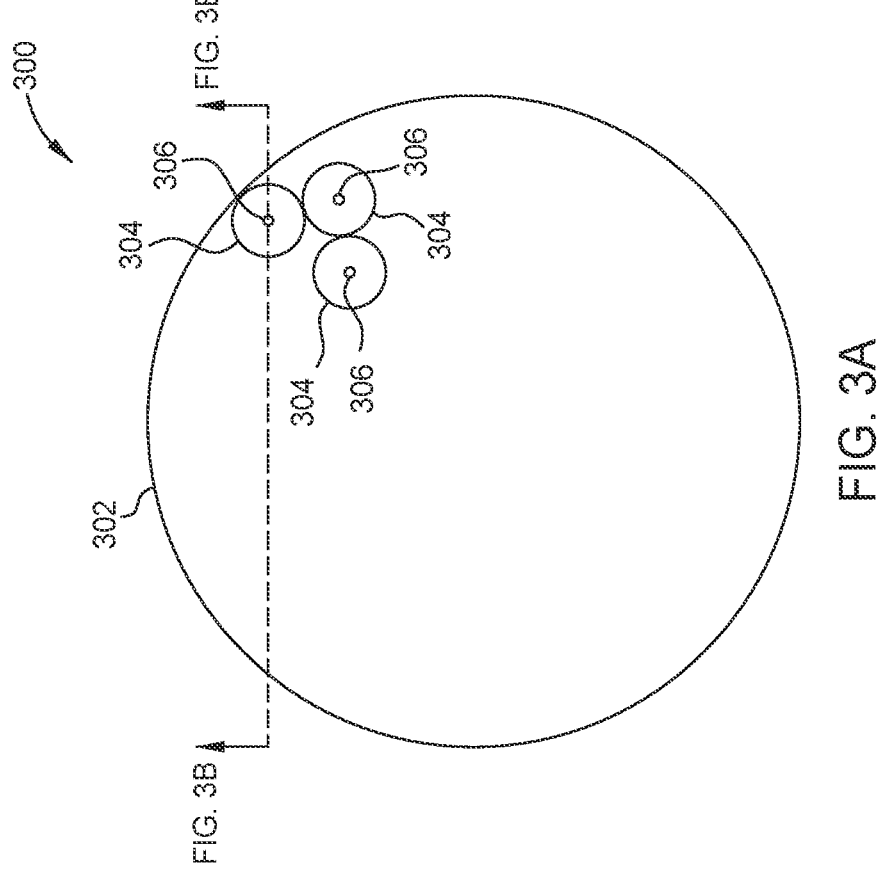
FIG. 3A is a top view of an example reflector plate assembly according to at least one embodiment of the present disclosure.

FIG. 3A shows a top view of an example reflector plate assembly 300 according to at least one embodiment of the present disclosure. FIG. 3B shows a cross-sectional view of the reflector plate assembly 300 shown in FIG. 3A, as indicated by "3B", according to at least one embodiment of the present disclosure. Reflector plate assembly 300 is utilized as a reflector plate (e.g., substituted for the reflector plate 130 of FIG. 1 or the reflector plate 222 of FIG. 2) with the RTP chamber 100 or the RTP chamber 200. Generally, the reflector plate assembly 300 described herein has multiple functions such as a high reflectivity at the pyrometer wavelengths, a high reflectivity for the wafer radiation spectrum, and a reflectivity consistency around the pyrometer embedded in each sub-reflector plate of the reflector plate assembly 300. Moreover, the reflector plate assembly 300 described herein shields the process space from contaminants, e.g., metals, and minimizes cross-talk between the pyrometers.

The reflector plate assembly 300 includes a reflector plate 302. A plurality of reflector disks 304 are embedded within the reflector plate 302. A pyrometer 306 is disposed through an opening of each reflector disk 304. Although three reflector disks 304 are shown, more or less reflector disks 304 can be utilized. Similarly, although three pyrometers 306 are shown, more or less pyrometers can be utilized. Simple methods for cutting out portions of the reflector plate 302 and inserting reflector disks 304 can be performed in order to replace reflector disks 304 for, e.g., different substrate processes. For example, holes can be drilled from a surface of the reflector plate 302, and reflector disks 304 can be inserted into the holes with O-rings for sealing.

The reflector plate 302 may be formed of bare aluminum, aluminum alloy, or silver, and the surface of the reflector plate 302 may be mechanically polished having reflectivity of about 95% at a wavelength of about 2 μm. Each reflector disk 304 may be formed of aluminum, quartz, or stainless steel.

The reflector disk 304 may be coated with a coating layer 308. The coating layer 308 may be formed of gold (Au), chromium (Cr), or silver (Ag), and have a thickness of between 50 nm and 5 μm. The coating layer 308 may enhance emissivity of the reflector disk 304 from about 0.85 to about 0.93 at the pyrometer wavelengths as compared to a reflector disk without a coating layer. The remaining surface of the reflector plate 302 may be a bare polished surface of aluminum without any coating. As compared to a conventional reflector plate that has the entire surface coated with quartz or other material, in the reflector plate assembly 300 according to the embodiments described herein, only the reflector disks 304 are coated and the remaining surface of the reflector plate 302 is not coated. Such selective coating of the reflector disks 304 or smaller regions around the pyrometers 306 increases reliability of coating, and further reduces manufacturing cost and replacement cost.

The reflector disk 304 may be further encapsulated by an encapsulating layer 310. The encapsulating layer 310 may be formed of a heat resistant and/or non-reactive (inert) material, such as silicon oxide ($SiO_2$) or sapphire, and have a thickness of between 50 nm and 1 μm. The encapsulating layer 310 is used to seal the reflector disk 304 from the reflector plate 302 for, e.g., increasing the accuracy of the pyrometers 306 which are disposed through reflector disks 304 to measure the temperature, and preventing outgassing of materials that make up reflector disks 304.

With reference to the RTP chamber 100 of FIG. 1 and the reflector plate assembly 300 of FIG. 3, each pyrometer 306 is adapted to measure the temperature of the substrate W corresponding to a zone of the substrate support 110 having an individual heating element 112 therein. Each pyrometer 306 can be coupled with a controller (e.g., controller 142), which is likewise coupled with a power source (e.g., power source 114). The controller 142 facilitates closed loop control of each zone of the substrate support 110 by controlling the power applied to each of the heating elements 112 by the power source 114.

With reference to the RTP chamber 200 of FIG. 2 and the reflector plate assembly 300 of FIG. 3, each pyrometer 306 is adapted to measure the temperature of the substrate W corresponding to the zones in which the lamps 218 are divided. In these embodiments, each reflector disk 304 can have an opening where the optical light pipe 234 is mounted. The temperature of each zone is adjusted in response to the signals from the plurality of pyrometers 306. Each pyrometer 306 can be coupled with a controller (e.g., controller 236), which is likewise coupled with a power source (not shown). The controller 236 receives the outputs of the pyrometers 232 and controls the voltages supplied to the different rings of lamps 218 to dynamically control the radiant heating intensity and pattern during the processing.

In some embodiments, the reflector disks 304 are made to further improve the reflectivity for the pyrometer wavelengths. For example, the reflector disks 304 can be sized to fill only the effective angle used to control the, e.g., adjacent lamp zone or substrate support zone. Such a size (in diameter) can be from about 10 mm to about 30 mm, such as from about 15 mm to about 25 mm.

In addition, the reflector disks 304 can be small enough to minimize cross-talk between near or adjacent zones as radiation from outside the effective angle is reduced or eliminated by the size of the reflector disk 304 and a ring of low reflectivity around the outer edge of the reflector disk 304.

The reflector plate 302 can generally have a diameter about equal to or slightly larger than that of the substrate support 110 such as about 1% larger or more. Each individual reflector disk 304 can have an area, relative to the area of the reflector plate 302, of about 3% or less, such as about 2% or less, such as about 1% or less, for example between about 0.5% and about 3%, such as from about 1% to about 2%, such as from about 1% to about 1.5%. In some embodiments, the total collective area of the reflector disks 304, relative to the reflector plate 302, can be about 15% or less, such as about 10% or less, such as from about 1% to about 10%, such as from about 2% to about 8%, such as from about 4% to about 6% or about 5% to about 10%.

The reflector plate 302, one or more reflector disks 304, or combinations can have the reflectivity of less than about 2, less than about 1, or less than about 0.3 for radiation having wavelengths below about 700 nm, and is less than about 2, less than about 1, or less than about 0.3 for radiation having wavelengths between 1200 nm and 10 μm. Other levels of reflection and absorption across the spectrum of radiation wavelength may also be utilized, e.g., reflectivity for radiation having wavelengths between about 1000 nm and about 1200 nm, between about 1200 nm and about 2100 nm, and between about 2100 nm and about 2400 nm.

As described herein, a reflector plate includes a plurality of reflector disks having coating thereon positioned within a reflector plate having a bare mechanically polished surface with no coating thereon. The coating of the reflector disks with gold (Au) or chromium (Cr) enhances emissivity of the reflector disks. The coating on the reflector disks is further encapsulated with silicon oxide (SiO2) or sapphire to reduce metal contamination. The coating on the reflector disks is further encapsulated with silicon oxide (SiO2) or sapphire to reduce metal contamination. Due to selective coating of the reflector disks or smaller regions around pyrometers, reliability of coating is increased and manufacturing cost and replacement cost are reduced.

While the foregoing is directed to embodiments of the present disclosure, other and further embodiments of the disclosure may be devised without departing from the basic scope thereof, and the scope thereof is determined by the claims that follow.

What is claimed is:

1. A reflector plate assembly for processing a substrate, comprising:
   a reflector plate having a first surface, wherein the first surface is a bare, polished, uncoated surface;
   a reflector disk embedded within the reflector plate from the first surface;
   a coating layer on the reflector disk; and

8 a pyrometer disposed through an opening of the reflector disk.

2. The reflector plate assembly of claim 1, wherein the reflector plate comprises aluminum or aluminum alloy.

3. The reflector plate assembly of claim 1, wherein the reflector disk comprises aluminum, quartz, or stainless steel.

4. The reflector plate assembly of claim 1, wherein the coating layer comprises gold (Au).

5. The reflector plate assembly of claim 1, wherein the coating layer comprises chromium (Cr).

6. The reflector plate assembly of claim 1, wherein the coating layer comprises silver (Ag).

7. The reflector plate assembly of claim 1, further comprising:
   an encapsulating layer on the coating layer.

8. The reflector plate assembly of claim 7, wherein the encapsulating layer comprises silicon oxide ($SiO_2$).

9. The reflector plate assembly of claim 7, wherein encapsulating layer comprises sapphire.

10. A reflector plate assembly for processing a substrate, comprising:
    a reflector plate having a first surface, wherein the first surface is a bare, polished, uncoated surface;
    a reflector disk embedded within the reflector plate from the first surface;
    a coating layer on the reflector disk;
    a pyrometer disposed through an opening of the reflector disk; and
    an encapsulating layer on the coating layer.

11. The reflector plate assembly of claim 10, wherein the reflector plate comprises aluminum.

12. The reflector plate assembly of claim 10, wherein the reflector disk comprises aluminum or quartz.

13. The reflector plate assembly of claim 10, wherein the coating layer comprises gold (Au), chromium (Cr), or silver (Ag).

14. The reflector plate assembly of claim 10, wherein the encapsulating layer comprises silicon oxide ($SiO_2$).

15. The reflector plate assembly of claim 10, wherein the encapsulating layer comprises sapphire.

16. A chamber for processing a substrate, comprising:
    a chamber body;
    a chamber lid disposed on the chamber body, the chamber lid comprising:
      a lid body; and
      a reflector plate assembly, the reflector plate assembly, comprising:
        a reflector plate having a first surface, wherein the first surface is a bare, polished, uncoated surface;
        a plurality of reflector disks embedded within the reflector plate from the first surface;
        a coating layer on each reflector disk of the plurality of reflector disks;
        a plurality of pyrometers, wherein each pyrometer of the plurality of pyrometers is disposed through an opening of a reflector disk of the plurality of reflector disks; and
        an encapsulating layer on the coating layer.

17. The chamber of claim 16, further comprising a plurality of zones in which a plurality of lamps are divided, wherein each pyrometer of the plurality of pyrometers corresponds to each zone of the plurality of zones.

18. The chamber of claim 17, further comprising a controller, the controller configured to receive outputs from the plurality of pyrometers and to control voltage supplied to the plurality of lamps.

19. The chamber of claim 16, further comprising a substrate support, the substrate support comprising a plurality of zones to heat a substrate positioned on the substrate support, wherein each pyrometer of the plurality of pyrometers corresponds to each zone of the plurality of zones.

20. The chamber of claim 19, further comprising a plurality of resistive heat elements, wherein a resistive heat element is disposed within each zone and the plurality of resistive heating elements are controlled by the pyrometer of each zone.

\* \* \* \* \*